US007242058B2

(12) United States Patent
Risaki

(10) Patent No.: US 7,242,058 B2
(45) Date of Patent: Jul. 10, 2007

(54) LATERAL SEMICONDUCTOR DEVICE USING TRENCH STRUCTURE AND METHOD OF MANUFACTURING THE SAME

(75) Inventor: Tomomitsu Risaki, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/155,960

(22) Filed: Jun. 17, 2005

(65) Prior Publication Data
US 2006/0001085 A1 Jan. 5, 2006

(30) Foreign Application Priority Data
Jul. 1, 2004 (JP) ............................. 2004-195887
May 18, 2005 (JP) ............................. 2005-144867

(51) Int. Cl.
*H01L 29/76* (2006.01)
(52) U.S. Cl. ............................. 257/330; 257/E27.091; 257/242
(58) Field of Classification Search ................ 438/242; 247/330, E27.091; 437/243
See application file for complete search history.

(56) References Cited

U.S. PATENT DOCUMENTS

| | | | | |
|---|---|---|---|---|
| 4,569,701 A * | 2/1986 | Oh | ............................. | 438/389 |
| 5,502,320 A * | 3/1996 | Yamada | ....................... | 257/302 |
| 6,297,101 B1 * | 10/2001 | Schaeffer | ..................... | 438/268 |
| 6,661,050 B2 * | 12/2003 | Tzeng et al. | ................. | 257/301 |
| 2003/0062573 A1 * | 4/2003 | Murakami | ................... | 257/347 |
| 2004/0183136 A1 * | 9/2004 | Williams et al. | ............ | 257/369 |
| 2004/0207009 A1 * | 10/2004 | Yamaguchi et al. | ........ | 257/329 |
| 2005/0167748 A1 * | 8/2005 | Onda et al. | ................. | 257/341 |
| 2006/0024890 A1 * | 2/2006 | Calafut | ....................... | 438/268 |

* cited by examiner

*Primary Examiner*—Thao P. Le
(74) *Attorney, Agent, or Firm*—Adams & Wilks

(57) ABSTRACT

A semiconductor device has a semiconductor substrate and a trench region having at least one trench disposed on a surface of the semiconductor substrate and having a trench length, a trench width and a trench depth. A well region is disposed in the substrate and surrounds the trench region. A source region and a drain region are disposed above the well region and around respective inner walls of the trench. The source region and the drain region are disposed in confronting relation relative one another and have a conductivity type different from a conductivity type of the well region. A gate insulating film is disposed on the surface of the semiconductor substrate and on an inner base and the inner walls of the trench. A gate electrode is disposed on the gate insulating film. A length of the gate electrode is shorter than the trench length and equal to a distance between the source region and the drain region.

19 Claims, 8 Drawing Sheets

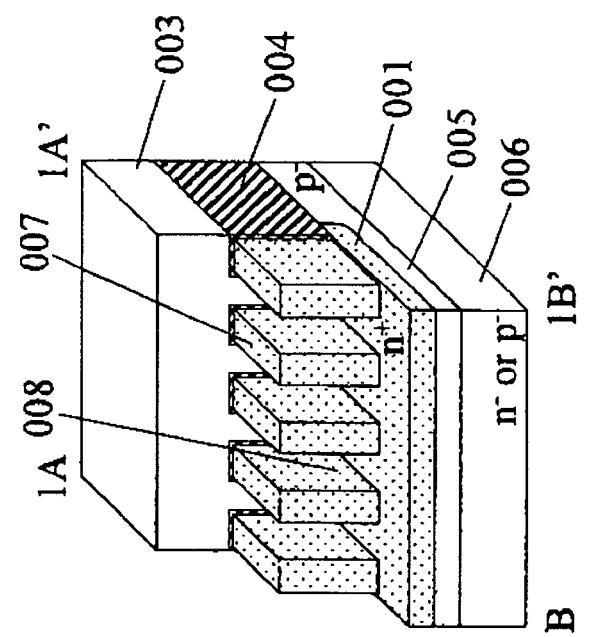
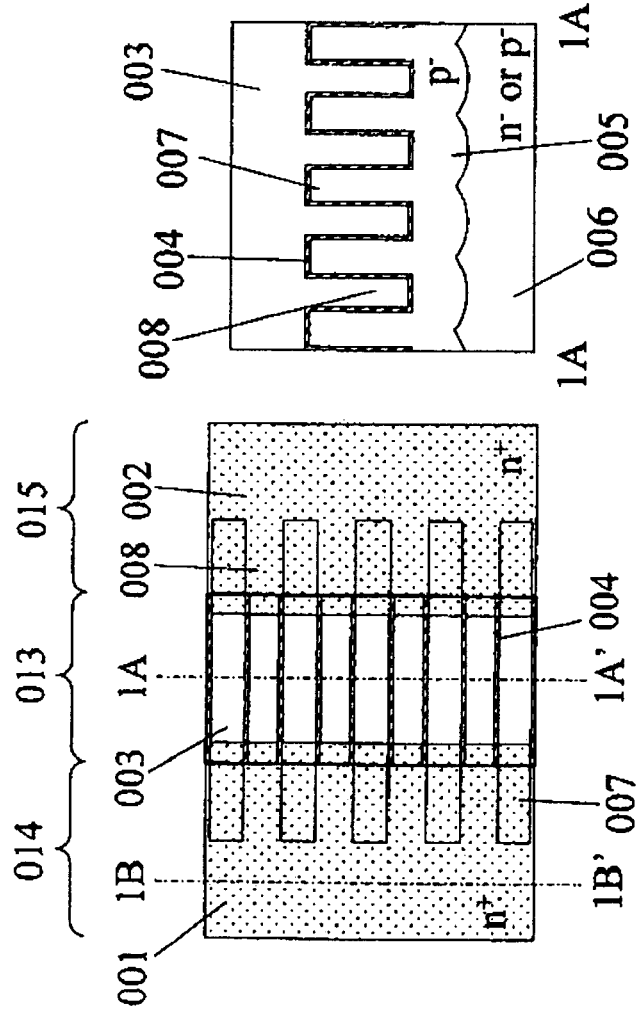
Fig.1 (a)  Fig.1 (b)  Fig.1 (c)

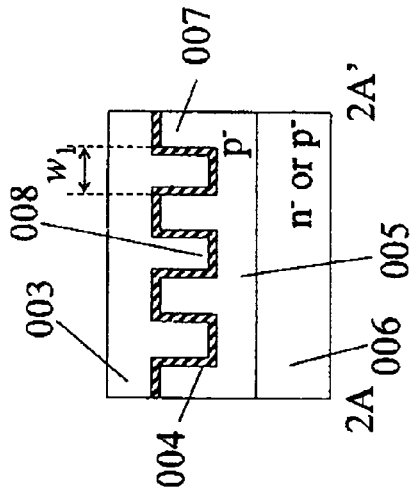
Fig.2 (b) PRIOR ART
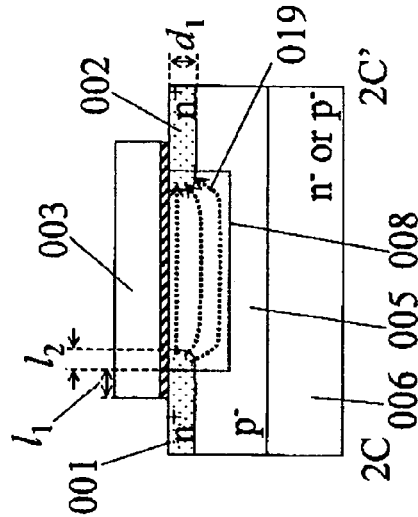
Fig.2 (a) PRIOR ART
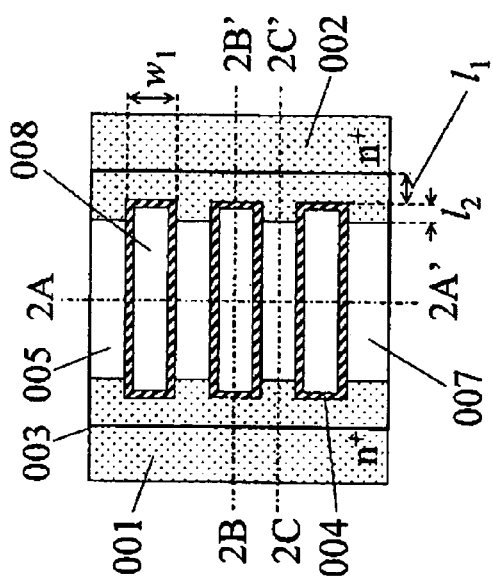
Fig.2 (d) PRIOR ART
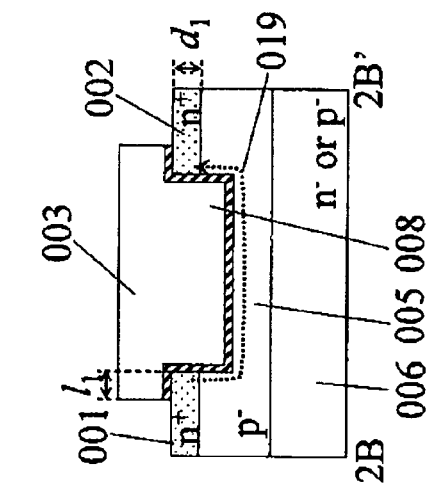
Fig.2 (c) PRIOR ART

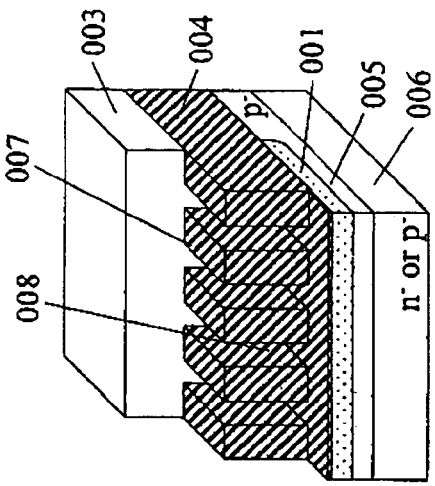
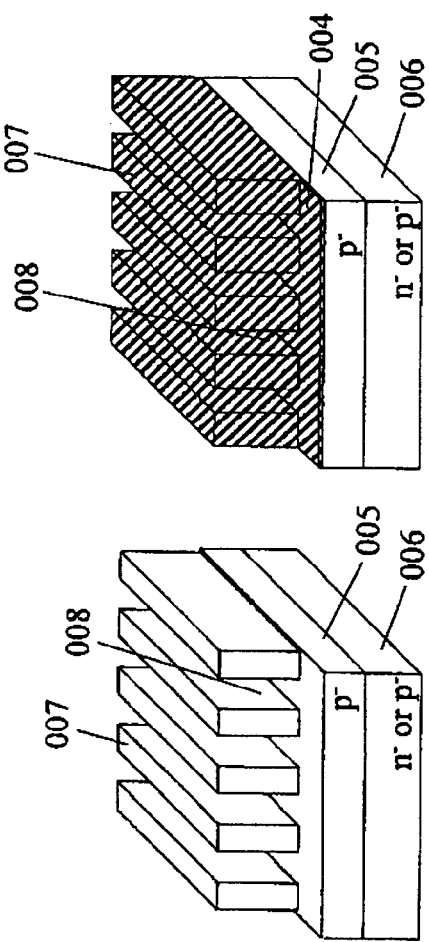
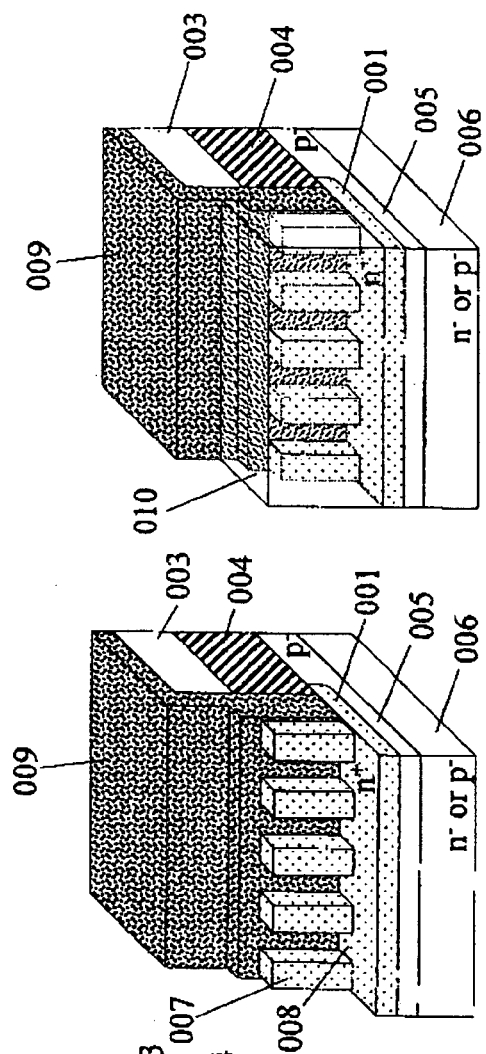
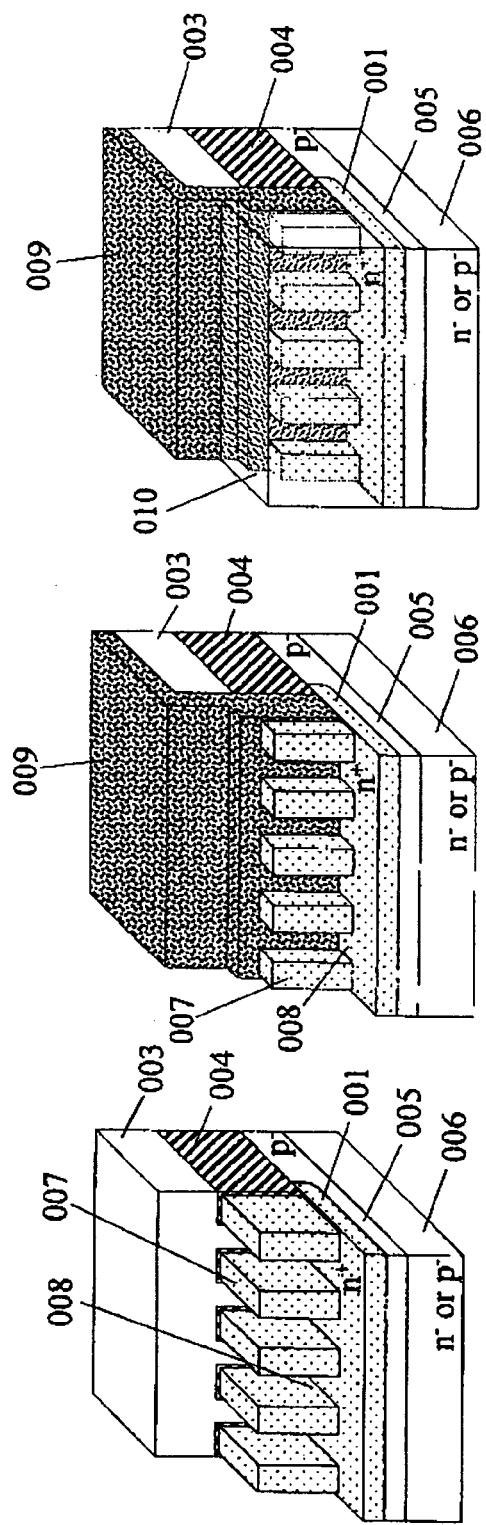

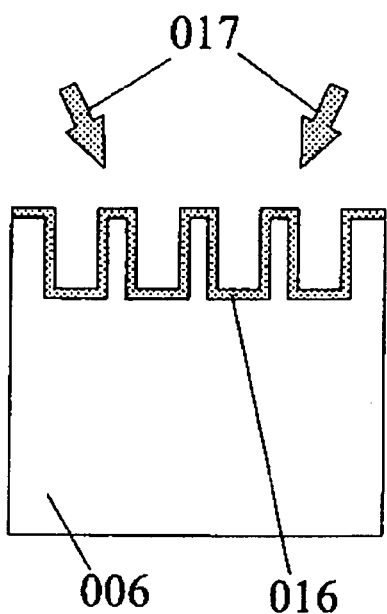
Fig.7 (a)
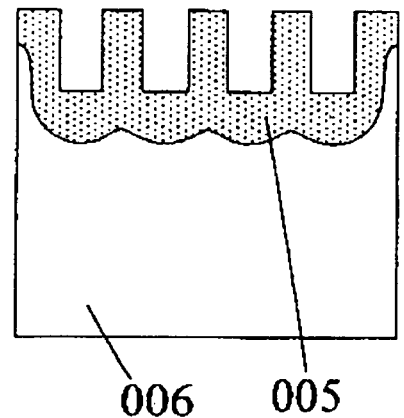
Fig.7 (b)
Fig.7
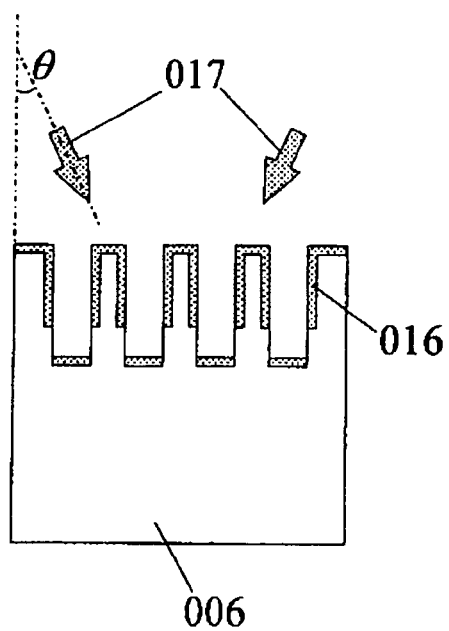
Fig.8 (a)
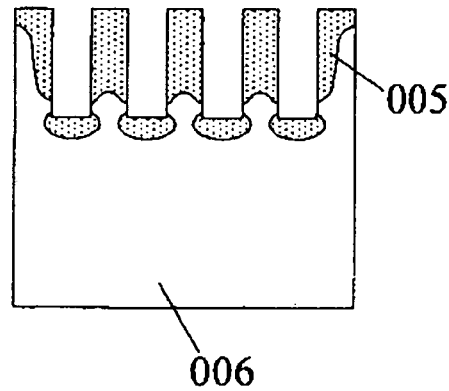
Fig.8 (b)

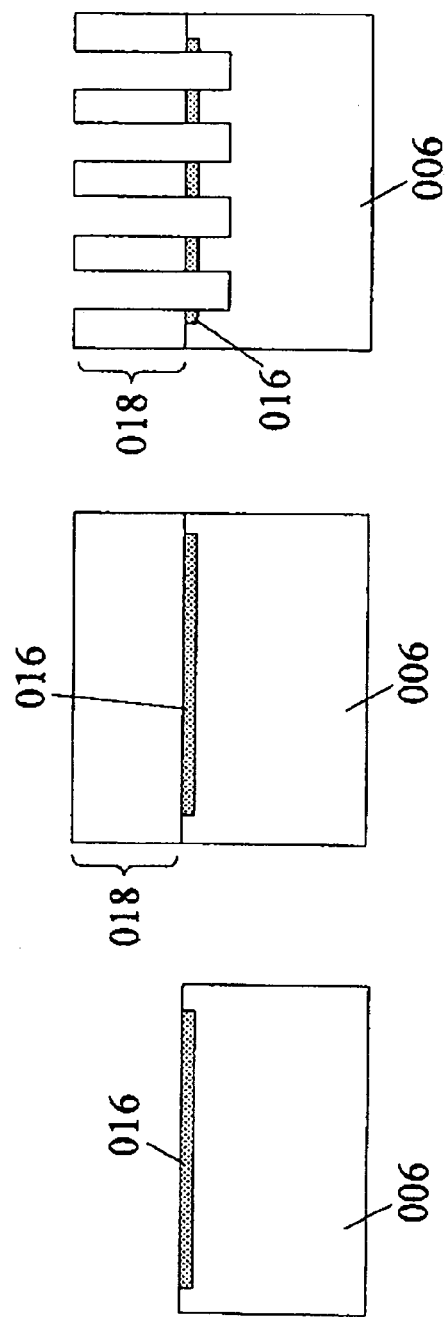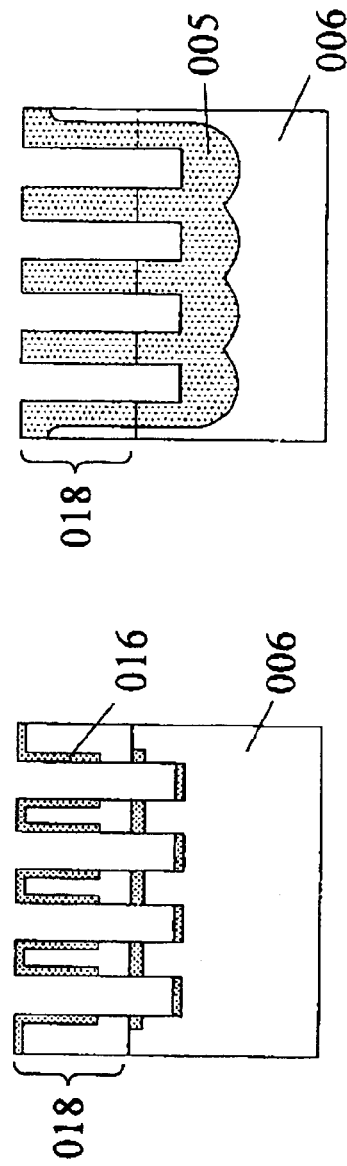

US 7,242,058 B2

LATERAL SEMICONDUCTOR DEVICE USING TRENCH STRUCTURE AND METHOD OF MANUFACTURING THE SAME

CROSS REFERENCE TO RELATED APPLICATION

This application claims the benefit of Japan Patent Application No. 2004-195887, filed Jul. 01, 2004 and Japan Application No. 2005-144867, filed May. 18, 2005, the contents of which are hereby incorporated herein by reference in their entirety.

BACKGROUND OF THE INVENTION

1. Field of the Invention

The present invention relates to a semiconductor device including a lateral MOS transistor for which high driving performance is required and to a method of manufacturing it.

2. Description of the Related Art

It has become possible to manufacture small geometry MOS transistors by using a progressive fine processing technique without lowering capability. This trend also applies, without exception, to semiconductor elements, for which high driving performance is required. In order to realize the high driving performance, reduction of an ON resistance of the element per unit plane area has been attempted with the best use of a fine processing technique. However, it is also a fact that the reduction of a withstand voltage, which is caused by miniaturization of the semiconductor element, hinders further improvement of the driving performance. Semiconductor devices with various structures have been proposed in order to eliminate the trade-off between the miniaturization and the withstand voltage. A trench gate MOS transistor, which is presently a mainstream semiconductor element, is given as an example in a power MOS transistor having a high withstand voltage and high driving performance. The trench gate MOS transistor has the highest degree of integration among the MOS transistors having high withstand voltage and high driving performance. The transistor shows extremely excellent performance as a single element, but has a disadvantage in mounting on a chip with standard elements for integrated circuit since the trench gate MOS transistor has a vertical MOS structure in which current flows in a depth direction of a substrate. When coexistence with integrated circuit standard elements on a chip is taken into account, a traditional lateral MOS structure is mostly selected.

As a method capable of reducing an ON resistance per unit area of the lateral MOS transistor without lowering a withstand voltage, a lateral trench gate transistor in which a gate portion has a structure having a convex portion and a concave portion to gain a larger gate width has been proposed (for example, refer to JP 3405681 B (p. 11, FIGS. 2A to 2B)). Attached FIGS. 2A to 2D show a lateral gate transistor shown in prior art. FIG. 2A is a plan view of the MOS transistor, FIG. 2B is a sectional view taken along the line 2A–2A', FIG. 2C is a sectional view taken along the line 2B–2B', and FIG. 2D is a sectional view taken along the line 2C–2C'. Here, a gate electrode 003 and a gate insulating film 004 outside trenches in FIG. 2A are shown transparently in order to give underlying structure. A bold line indicates an edge of the gate electrode 003. The prior art was made to reduce the ON resistance by introducing trench structure to the gate electrode 003 to extend the gate width per unit area of a lateral MOS structure.

However, the prior art has two problems.

(1) FIG. 3 is a perspective view obtained by taking out only a source region 001 or a drain region 002 shown in FIGS. 2A to 2D. Here, the gate oxide film 004 and the gate electrode 003 are not shown. In the source region 001 or the drain region 002 shown in FIG. 3, a dark-color portion of a surface which contacts with a trench wall indicated by dotted lines is a portion 020 that contacts with a channel portion. The portion 020 that contacts with the channel portion exists on each of all the surfaces, in the source region 001 or drain region 002, which contact with the trench wall. That is, in the structures of FIGS. 2A to 2D, a contact area between the source region 001 or drain region 002 and the channel portion is determined by dimensions $d_1$, $w_1$, and $l_2$. When the contact area is small, the area serves as a bottleneck as shown by current 019 shown in FIG. 4D (current density becomes dense in the source region and the drain region), which inhibits the reduction of the ON resistance. It is sufficient to extend the lengths of the dimensions $d_1$, $w_1$, and $l_2$ in order to increase the contact area. First, the dimension $d_1$ is considered. The dimension $d_1$, which corresponds to the depth of each of the source region 001 and the drain region 002 in the case where each of the source region and the drain region is formed through normal ion implantation, is generally shallow, several thousands of Å, and there is a limit to its depth. When the dimension $w_1$, which corresponds to the width of the concave portion of the trench, is extended without changing the width of the convex portion of the trench, the number of trenches per unit area decreases, and thus, the vertical contact area decreases. This shortens the gate width, and therefore, the dimension $w_1$ cannot be lengthened.

As regards a method of extending the $l_2$ as an overlap length between the source region 001 or the drain region 002 and the trench, when $l_2$ is extended without changing the gate length, it is clear that the area increases accordingly. Further, in the case where the source region 001 and the drain region 002 are formed by self-alignment to the gate electrode 003, a method of extending $l_2$ or a method of increasing the diffusion length of the impurities for the source region 001 and the drain region 002 is considered though, there are limitations to shortening $l_2$. After all, there is no way but a method of extending $l_2$ through the diffusion of the impurities. However, this method also has limitation on the length, and additionally, has a risk such as the reduction in concentration of the source region 001 or the drain region 002, which is caused by the excessive impurity diffusion. This method is, therefore difficult to be actually performed. That is, it is difficult to increase contact area in the prior art without changing the element area to reduce the ON resistance of the MOS transistor.

(2) The second problem is that there is a limitation to the trench depth. Increasing the trench width can further increase the gate width per unit area. However, this only applies to the case in a well region 005. There is a limitation to the depth of the well region 005 formed by a standard method. Thus, the trench cannot be deeper than the well region 005. If the trench is made deeper than the well region 005, current leaks to the substrate.

SUMMARY OF THE INVENTION

The present invention has been made to solve the above-mentioned two problems and to realize a low ON resistance lateral MOS transistor with high driving performance. A lateral MOS transistor with high driving performance includes a gate electrode formed on trenches whose lengthwise direction is parallel to gate length direction (channel length direction), and which has a long gate width per unit plane area. The lateral MOS transistor of the present invention attains the high driving performance without increasing a planar element area.

The present invention provides:

A semiconductor device, including: a first trench region in which trenches of which lengthwise direction is parallel to a gate length direction are formed on a surface of a semiconductor substrate; a second trench region and a third trench region which are provided on the same plane as a bottom surface of a concave portion of the first trench region to respectively contact with both ends of the first trench region in its lengthwise direction; a second conductivity type well region formed in at least one of the first trench region, the second trench region, and the third trench region; a gate insulating film provided in the first trench region; a gate electrode provided to contact onto the gate insulating film; and a first conductivity type source region and drain region which are provided shallower than the well region in the first trench region, the second trench region, and the third trench region.

According to the present invention, in the MOS transistor in which the gate electrode is formed with the trenches, the entire surface of one of the ends of the channel portion and the entire surface of the other end thereof sufficiently contact with the source region and the drain region, respectively. Thus, the contact area is increased, and resultingly, the ON resistance of the transistor is reduced.

BRIEF DESCRIPTION OF THE DRAWINGS

In the accompanying drawings:

FIGS. 1A to 1C are views showing a basic structure of an embodiment of the present invention, in which: FIG. 1A is a plan view; FIG. 1B is a sectional view taken along the line 1A–1A' of FIG. 1A; and FIG. 1C is a perspective view cut along the line 1A–1A' and the line 1B–1B' of FIG. 1A;

FIGS. 2A to 2D are views showing a conventional embodiment in which: FIG. 2A is a plan view; FIG. 2B is a sectional view taken along the line 2A–2A' of FIG. 2A; FIG. 2C is a sectional view taken along the line 2B–2B' of FIG. 2A, in which an arrow indicates current flow; and FIG. 2D is a sectional view taken along the line 2C–2C' of FIG. 2A, in which an arrow indicates current flow;

FIGS. 4A to 4F are perspective views showing manufacturing steps according to the present invention;

FIGS. 7A and 7B are sectional views in the case where a trench depth is relatively shallow, in which: FIG. 7A is a sectional view immediately after multi-directional oblique ion implantation; and FIG. 7B is a sectional view in which thermal diffusion of ions is performed after the multi-directional oblique ion implantation;

FIGS. 8A and 8B are sectional views in the case where the trench depth is deep and an ion implantation angle θ is large, in which: FIG. 8A is a sectional view immediately after multi-directional oblique ion implantation; and FIG. 8B is a sectional view in which thermal diffusion of ions is performed after the multi-directional oblique ion implantation;

FIGS. 10A to 10E show a method of manufacturing a well with the use of an epitaxial technique and an oblique ion implantation method, in which: FIG. 10A is a sectional view in which ion implantation is performed to a surface of a semiconductor substrate; FIG. 10B is a sectional view in which a semiconductor film is formed on the substrate surface shown in FIG. 10A through epitaxial growth; FIG. 10C is a sectional view in which a trench structure is formed to the resultant of FIG. 10B; FIG. 10D is a sectional view in which multi-directional oblique ion implantation is performed to the resultant of FIG. 10C; and FIG. 10E is a sectional view in which thermal diffusion is performed to the resultant of FIG. 10D.

DETAILED DESCRIPTION OF THE PREFERRED EMBODIMENTS

Embodiment 1

Figure 3:
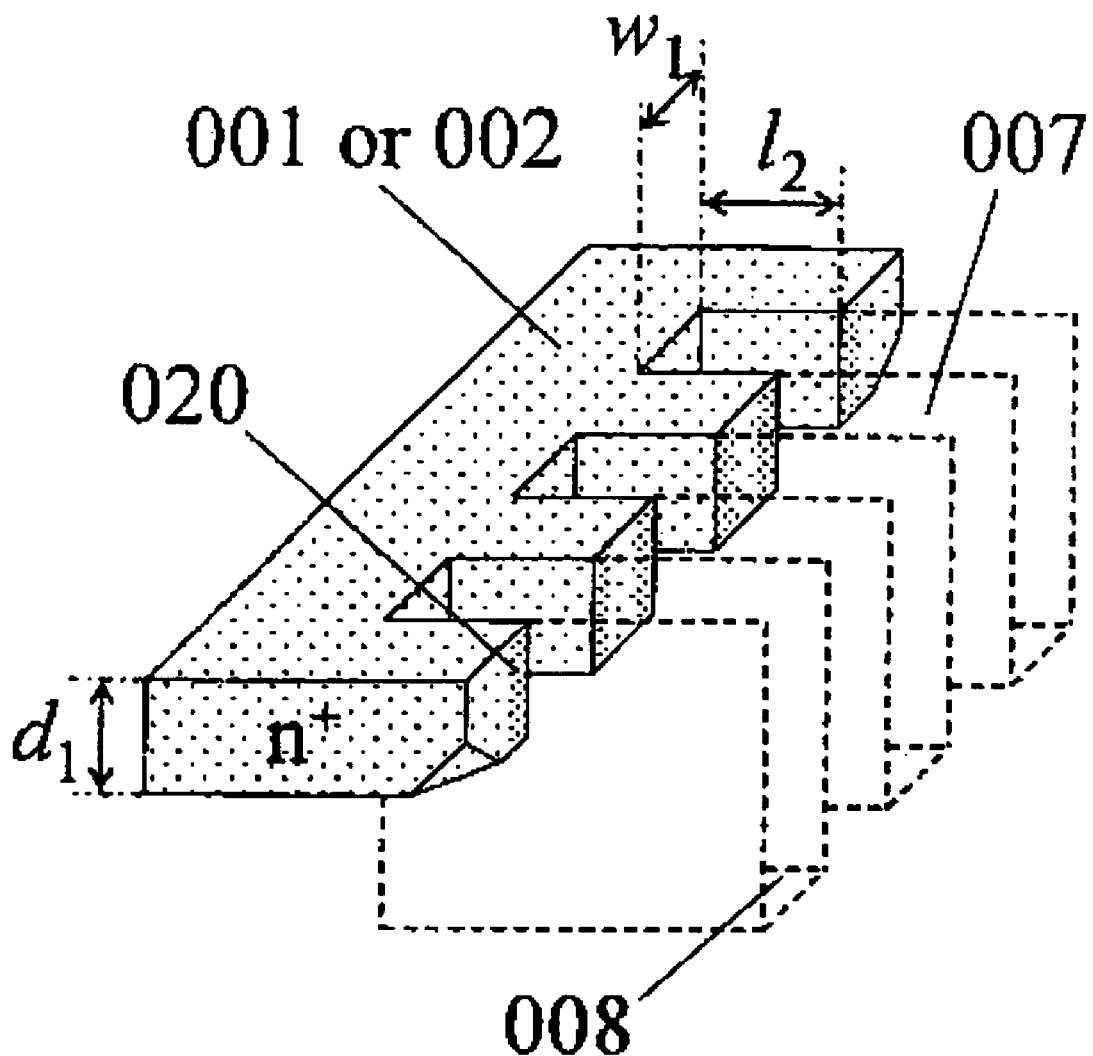
FIG. 3 is a perspective view of a source region 001 or drain region 002 of FIGS. 2A to 2D.

FIGS. 1A to 1C show a typical embodiment of the present invention. Here, FIG. 1A is a plan view, FIG. 1B is a sectional view taken along the line 1A–1A' of FIG. 1A, and FIG. 1C is a perspective view cut along the line 1A–1A' and the line 1B–1B' of FIG. 1A. Here, in FIG. 1A, a gate electrode 003 and a gate insulating film 004 on trenches are transparent so as to be viewed easily. A bold line indicates an edge of the gate electrode 003. Further, FIG. 1C is a view seen from a source region 001. In this drawing no metal interconnect is omitted in order to show source and drain structure in three-dimensionally. This figure shows a symmetrical structure with the line 1A–1A' as its center. Thus, the view seen from a drain region 002 is same as FIG. 1C. Note that the symmetrical structure is taken for easy understanding in the explanation of the embodiment of the present invention; however, the symmetry is not necessary in implementing the present invention.

Hereinafter, description will be made of a structure of a MOS transistor shown in FIGS. 1A to 1C and a method of manufacturing the same in accordance with manufacturing steps. FIGS. 4A to 4F show the manufacturing steps of the MOS transistor shown in FIGS. 1A to 1C based on the same view as that of FIG. 1C, and the drain region 002 is omitted from the reason that the region has the same structure as that of the source region 001.

First, a surface of a first conductivity type, for example, N-type or second conductivity type, for example, P-type is subjected to etching as shown in FIG. 4A, thereby forming a first trench region 013, a second trench region 014, and a third trench region 015 which have a bottom surface 008 of a concave portion. Thereafter, oblique ion implantation in multiple directions and impurity diffusion are performed, thereby forming a well region 005 of the second conductivity type, for example, P-type, which forms a channel of the transistor, in the first trench region 013, the second trench region 014, and the third trench region 015. Here, as regards the ion implantation for forming the well region 005, the oblique ion implantation in multiple directions is performed immediately after the formation of the trench regions as shown in FIG. 7A. While ions are implanted to side surfaces and bottom surfaces of the trenches through bilateral oblique ion implantation 017, ions are implanted to upper surfaces and the bottom surfaces of the trenches through oblique ion implantation (not shown) in front-side and backside directions. Then, as shown in FIG. 7B, the well region 005 is formed deeper than the trench bottom portion through thermal diffusion. The trench can be reliably formed deeper compared with the method in which the trench regions are formed after the formation of the well region 005. Thus, the gate width per unit area can be increased. Accordingly, the above-mentioned problem can be solved.

However, even the above method has limitations on a trench depth. When the trench depth is simply increased without changing an angle θ in the oblique ion implantation, there is developed a part, to which ions are not implanted, of the side surface in the region of the trench bottom portion, as shown in FIG. 8A. Thus, the well region 005 does not surround all the trenches even after thermal diffusion, as shown in FIG. 8B. On the other hand, when the angle θ in the oblique ion implantation is made smaller in order that ions are implanted to the trench side surface in the region of the trench bottom portion, the ions are not sufficiently implanted to the trench side surfaces. As a result, the ion concentration profile of the well after thermal diffusion does not become constant.

However, the trench width can be increased to exceed the limitation by combining the oblique ion implantation with an epitaxial technique. As shown in FIG. 10A, the surface of the semiconductor substrate 006 is subjected to ion implantation. Then, as shown in FIG. 10B, a semiconductor film is deposited through epitaxial growth. Thereafter, a trench structure is formed as shown in FIG. 10C, and oblique ion implantation in multiple directions is performed as shown in FIG. 10D. Since an ion implantation layer exists between the epitaxial layer and the semiconductor substrate, the well surrounding all the trenches can be formed through thermal diffusion as shown in FIG. 10E. With this method, the trench width can be further increased, and thus, the gate width per unit area can be further increased.

Next, as shown in FIG. 4B, the substrate surface is subjected to thermal oxidization, the gate insulating film 004 is formed, and a polysilicon film is deposited thereon to form the gate electrode 003. The polysilicon film is subjected to selective etching such that the gate electrode 003 is left as shown in FIG. 4C.

Next, ion implantation and impurity diffusion are performed. Through self-alignment with the gate electrode 003, the source region and the drain region 002 of the first conductivity type, for example, N-type are formed in the first trench region, the second trench region, and the third trench region which are not covered by the gate electrode to attain the structure shown in FIG. 4D. Here, the source region 001 and the drain region 002 are formed onto the entire surface of the convexo-concave structure including a convex portion 007 and the concave portion 008 by performing the oblique ion implantation in multi directions. Thus, the entire surfaces of both the ends of the channel portion of the transistor under the gate electrode 003 directly contact with the source region 001. Therefore, the contact area between the channel portion and the source region 001 and drain region 002 is large, which reduces the contact resistance. Accordingly, the above-mentioned other problem can be solved.

Subsequently, as shown in FIG. 4E, an insulating film 009 is deposited so as to cover the entire surface of the semiconductor substrate. Then, a part of the insulating film 009 on the source region 001 and the drain region 002 is subjected to etching, whereby parts of the source region 001 and the drain region 002 are exposed.

Next, as shown in FIG. 4F, an electrode film is deposited to cover the entire surface of the semiconductor substrate. Then, the electrode film is removed by etching while a part thereof to be an electrode film 010 that is connected with the source region 001 and the drain region 002.

Finally, a passivation film (not shown) is formed to a surface of the structure shown in FIG. 4F. The source region 001, the gate electrode 003, and the drain region 002 are formed with contact holes. Then, the respective electrodes are taken out. As a result, the lateral MOS transistor with high driving performance and low ON resistance is completed.

Although depending on the manufacturing condition or element operation condition of the MOS transistor, the entire inner portion of the convex portion is brought into a depletion state when the MOS is turned on by setting the width of the convex portion of the first trench region to approximately 1,000 Å. Resultingly, the sub-threshold characteristic is enhanced. Therefore, the leak between the source and the drain is decreased, which can lower the threshold. As a result, the driving performance can be improved further. The basic structure and manufacturing method of the present invention have been described above.

Hereinabove, the embodiment of the present invention has been described with the so-called planar MOS transistor; however, various structures exist for the planar MOS with the aim to improve the withstand voltage. Therefore, in the present invention, the improvement of the withstand voltage can be attained easily by using conventional techniques of a DDD (double diffused drain) structure, an LDMOS (lateral double diffused MOS) structure, and the like. Hereinafter, those will be explained.

Embodiment 2

Figure 5:
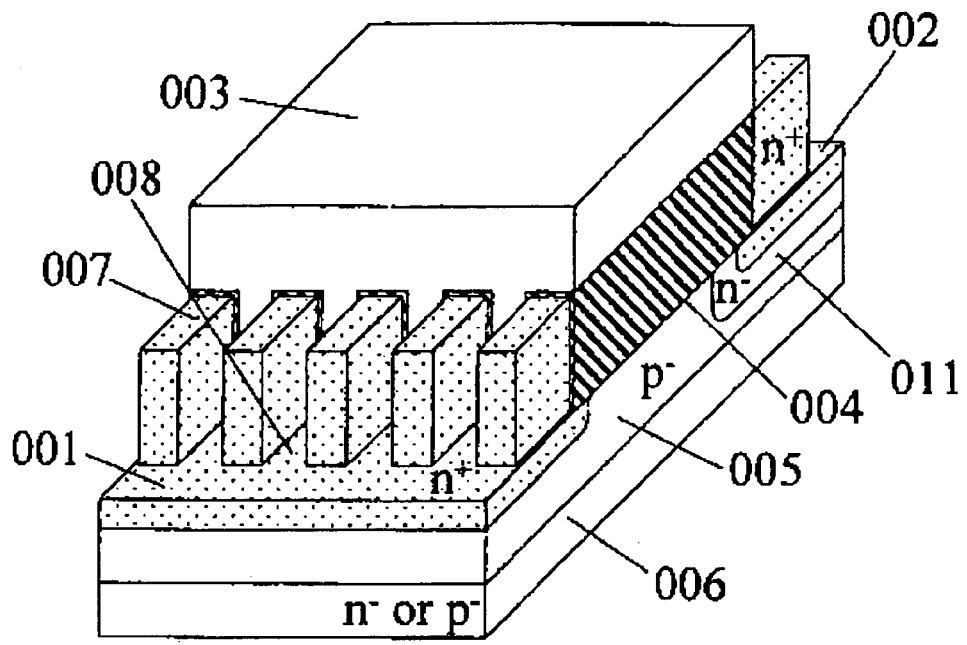
FIG. 5 is a perspective view of an embodiment including a DDD (double doped drain) structure according to the present invention.

FIG. 5 shows an embodiment of the present invention, which has a DDD structure. A different point of Embodiment 2 from that in Embodiment 1 is that only the third trench region 15 is opened before the formation of the source region 001 and the drain region 002, and a low level diffusion region 011 is formed which includes the drain region 002 formed in the subsequent step. Therefore, a high-driving performance MOS transistor with a high withstand voltage and a low ON resistance is completed.

Embodiment 3

Figure 6:
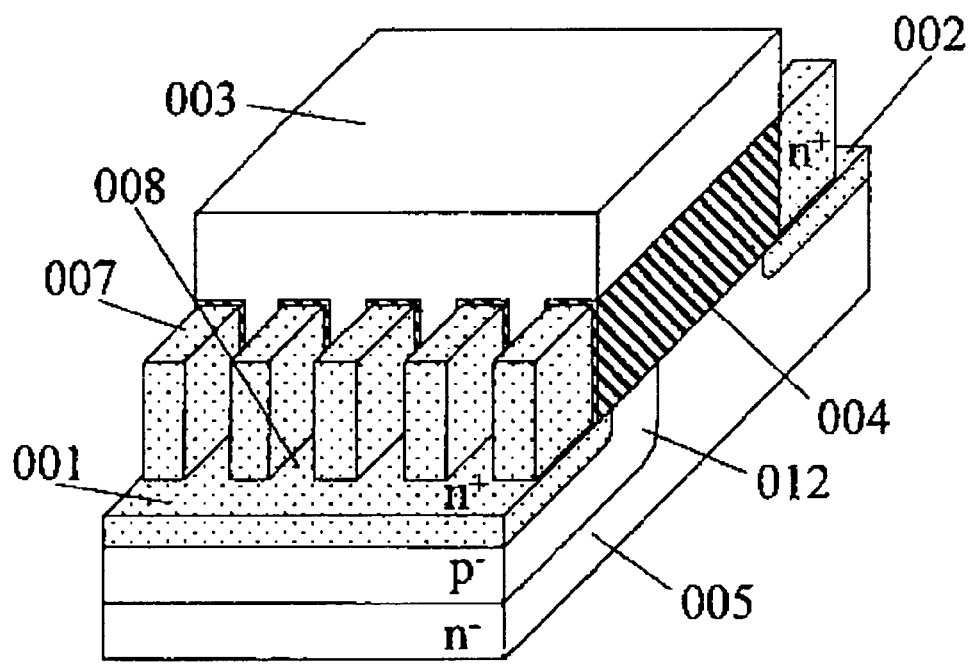
FIG. 6 is a perspective view of an embodiment including an LDMOS (laterally diffused metal oxide semiconductor structure according to the present invention.
Figure 9:
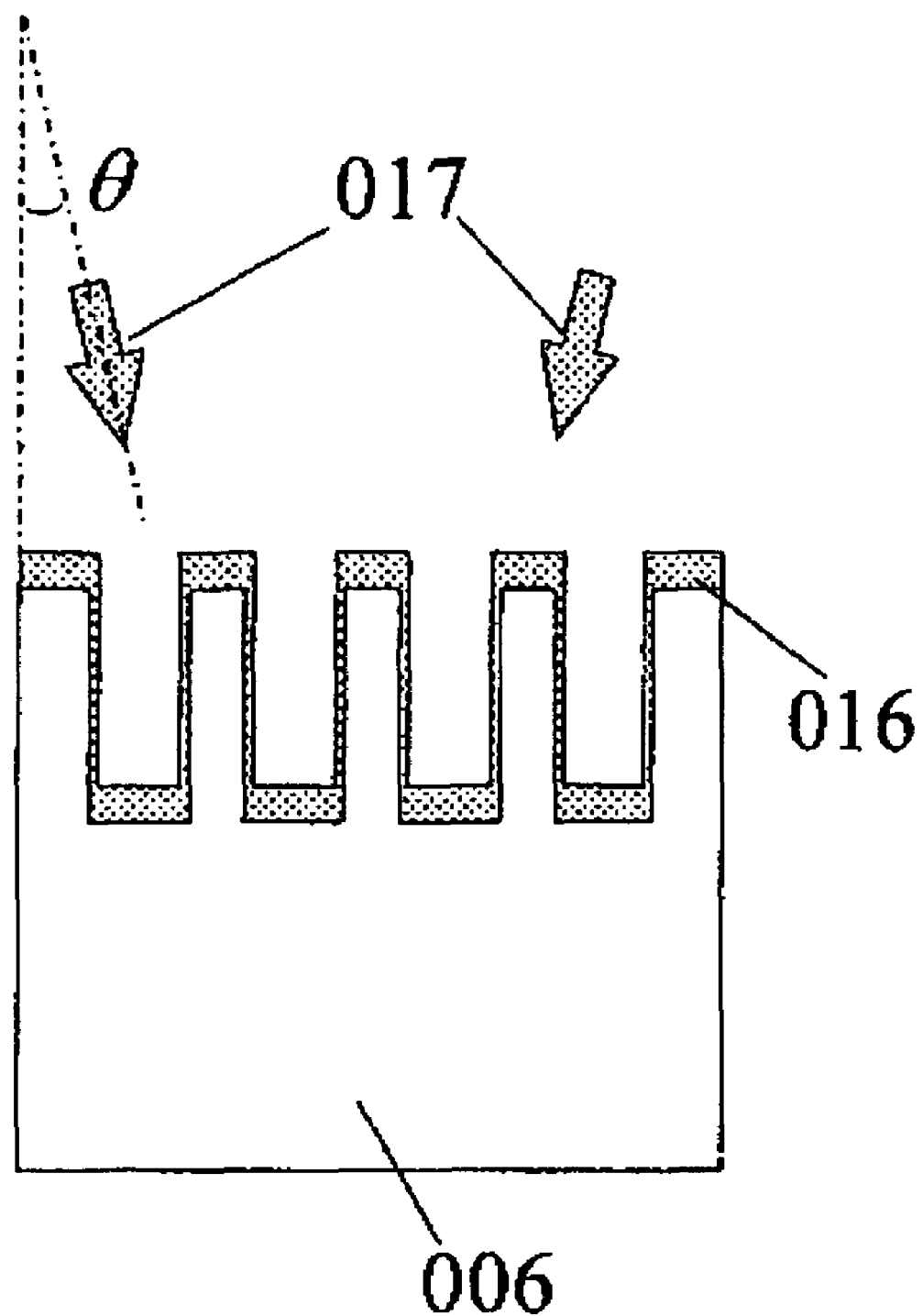
FIG. 9 is a sectional view immediately after ion implantation with a deep trench depth and a small ion implantation angle θ.

FIG. 6 shows an embodiment of the present invention, which has an LDMOS structure. A different point of Embodiment 3 from that in Embodiment 1 is that only the second trench region 14 is opened before the formation of the source region 001 and the drain region 002, and a body region 012 is formed which does not include the drain region 002 which are formed in the subsequent step but increases the source region 001. Therefore, a high-driving performance MOS transistor with a high withstand voltage and a low ON resistance is completed.

Described above is the embodiment of the present invention which includes the NMOS transistor in which a first conductivity type is N-type and a second conductivity type is P-type. With the use of the structure of this embodiment of the present invention, the driving performance per unit plane area can be enhanced while the same withstand voltage as that of a general planar type MOS transistor is maintained. Thus, the bottom surface of the concave portion 008 can be formed deeper without consideration to the depth of the well region 005. Therefore, the driving performance can be further improved. Further, the contact resistance between the source region 001 and drain region 002 and the well region is lowered automatically by increasing the gap between the upper surface of the convex portion and the bottom surface of the concave portion. Thus, the driving performance per unit plan area can be improved efficiently. In the above embodiments, needless to say, a PMOS transistor structure can be formed in the same manner by inverting the conductivity types. Moreover, with the use of a twin well method in which an N-well region for forming a PMOS transistor and a P-well region for forming an NMOS transistor are formed, a CMOS structure having high driving performance with one chip can be formed with ease.

Furthermore, the present invention is not limited to the above embodiments, and can be modified to implement within a range that does not depart from the gist of the invention.

What is claimed is:

1. A semiconductor device, comprising:
    a first trench region having a plurality of trenches formed on a surface of a semiconductor substrate;
    a second trench region and a third trench region disposed on the same plane as a bottom surface of a concave portion of the first trench region so that the second trench region and the third trench region contact respective opposite ends of the first trench region in the lengthwise direction thereof;
    a well region formed in the first trench region, the second trench region, and the third trench region;
    a gate insulating film disposed in the first trench region;
    a gate electrode disposed on the gate insulating film, the gate electrode having a length extending in a direction generally parallel to lengthwise directions of the trenches;
    a source region having a conductivity type different from a conductivity type of the well region, the source region being disposed above the well region and in the second trench region and in a first portion of the first trench region; and
    a drain region having the same conductivity type as that of the source region, the drain region being disposed above the well region and in the third trench region and in a second portion of the first trench region.

2. A semiconductor device according to claim 1; wherein the semiconductor device has a DDD (double doped drain) structure.

3. A semiconductor device according to claim 1; wherein the semiconductor device has an LDMOS (laterally diffused metal oxide semiconductor) structure.

4. A semiconductor device according to claim 1; wherein a width of a convex portion in the first trench region is approximately 1,000 Å.

5. A semiconductor device according to claim 2; wherein a width of a convex portion in the first trench region is approximately 1,000 Å.

6. A semiconductor device according to claim 3; wherein a width of a convex portion in the first trench region is approximately 1,000 Å.

7. A semiconductor device according to claims 1; wherein the semiconductor device is formed by a semiconductor process that implements twin well technology.

8. A semiconductor device according to claim 2; wherein the semiconductor device is formed by a semiconductor process that implements twin well technology.

9. A semiconductor device according to claim 3; wherein the semiconductor device is formed by a semiconductor process that implements twin well technology.

10. A semiconductor device according to claim 4; wherein the semiconductor device is formed by a semiconductor process that implements twin well technology.

11. A semiconductor device according to claim 5; wherein the semiconductor device is formed by a semiconductor process that implements twin well technology.

12. A semiconductor device according to claim 6; wherein the semiconductor device is formed by a semiconductor process that implements twin well technology.

13. A semiconductor device comprising:
    a semiconductor substrate;
    a trench region having at least one trench disposed on a surface of the semiconductor substrate and having a trench length, a trench width and a trench depth;
    a well region disposed in the substrate and surrounding the trench region;
    a source region and a drain region disposed above the well region and disposed around inner walls of the trench, and the source region and the drain region being disposed in confronting relation relative one another and having a conductivity type different from a conductivity type of the well region;
    a gate insulating film disposed on the surface of the semiconductor substrate and on an inner base and the inner walls of the trench; and
    a gate electrode disposed on the gate insulating film, a length of the gate electrode being shorter than the trench length and equal to a distance between the source region and the drain region.

14. A semiconductor device according to claim 13; wherein the semiconductor device has a double doped drain structure.

15. A semiconductor device according to claim 13; wherein the semiconductor device has a laterally diffused metal oxide semiconductor structure.

16. A semiconductor device according to claim 13; wherein a width of a convex portion of the trench is approximately 1,000 Å.

17. A semiconductor device comprising:
    a semiconductor substrate;
    a plurality of trenches formed on a surface of the semiconductor substrate, each of the trenches having a concave portion and a convex portion;
    a gate insulating film disposed on the concave portions and the convex portions of the trenches;
    a gate electrode disposed on the gate insulating film;
    a source region and a drain region each having upper surfaces disposed in coplanar relation to base surfaces of the concave portions of the trenches; and
    a well region disposed under the source and drain regions.

18. A semiconductor device according to claim 17; wherein the trench has a length extending in a direction generally parallel to a length direction of the gate electrode.

19. A semiconductor device according to claim 18; wherein the length of the gate electrode is shorter than the length of the trench; and wherein the source region and the drain region are spaced apart a distance equal to the length of the gate.

* * * * *